US005986894A

United States Patent [19]
Lint et al.

[11] Patent Number: 5,986,894
[45] Date of Patent: Nov. 16, 1999

[54] MICROELECTRONIC COMPONENT CARRIER AND METHOD OF ITS MANUFACTURE

[75] Inventors: James D. Lint; Nanci Vogtli, both of Cardiff, Calif.

[73] Assignee: Pulse Engineering, Inc., San Diego, Calif.

[21] Appl. No.: 09/045,379

[22] Filed: Mar. 19, 1998

Related U.S. Application Data
[60] Provisional application No. 60/060,389, Sep. 30, 1997.

[51] Int. Cl.[6] .............................. H05K 5/02; H05K 7/02; H01F 27/28
[52] U.S. Cl. .......................... 361/813; 336/229; 361/807
[58] Field of Search .............................. 29/602.1, 603.01, 29/603.04, 603.23, 605, 606, 835, 838, 845; 228/164, 165, 170, 174; 257/528, 531, 666, 668, 669, 672, 674, 676, 678; 361/772, 773, 774, 777, 782, 807, 809, 813, 821, 836; 439/180, 70, 72

[56] References Cited

U.S. PATENT DOCUMENTS

| | | |
|---|---|---|
| 3,287,795 | 11/1966 | Chambers et al. . |
| 3,370,203 | 2/1968 | Kravitz et al. . |
| 3,469,684 | 9/1969 | Keady et al. . |
| 4,521,828 | 6/1985 | Fanning . |
| 4,698,660 | 10/1987 | Kubota et al. . |
| 4,803,544 | 2/1989 | Holzschuh et al. . |
| 4,821,152 | 4/1989 | Lorenzen . |
| 4,906,802 | 3/1990 | Castleman . |
| 4,916,518 | 4/1990 | Yoshimura . |
| 5,042,146 | 8/1991 | Watson . |
| 5,162,894 | 11/1992 | Asano et al. . |
| 5,185,653 | 2/1993 | Switky et al. . |
| 5,200,364 | 4/1993 | Loh . |
| 5,263,242 | 11/1993 | Singh Deo et al. . |
| 5,270,262 | 12/1993 | Switky et al. . |
| 5,343,106 | 8/1994 | Lim et al. . |
| 5,345,670 | 9/1994 | Pitzele et al. . |
| 5,375,320 | 12/1994 | Kinsman et al. . |
| 5,402,321 | 3/1995 | Izu et al. . |
| 5,451,715 | 9/1995 | Hundt et al. . |
| 5,455,741 | 10/1995 | Wai et al. . |
| 5,483,024 | 1/1996 | Russell et al. . |
| 5,541,451 | 7/1996 | Kusumi . |

OTHER PUBLICATIONS

James D. Lint et al., pending patent application entitled "Surface Mount Toroid Holder and Lead Frame," 08/783,094 no class/no sub on Dec. 10, 1996.

*Primary Examiner*—Donald Sparks
*Attorney, Agent, or Firm*—Knobbe, Martens, Olson & Bear LLP

[57] ABSTRACT

A microelectronic component carrier package and method of its manufacture. A non-conducting component carrier having vertical risers and guide channels permits the rapid and accurate routing of microelectronic component leads with respect to the leadframe. Specially shaped perforations in the leadframe adjacent to and aligned with the guide channels receive the leads, strip away the necessary amount of insulation, and sever the leads to the proper length in one manufacturing process step. The leads are joined to the leadframe by an interference fit, conventional bonding technique (such as solder or thermal compression bonding), or other techniques. The perforations further provide for stress relief of the leads in the assembled package, and permit the joints between the leadframe and leads to reside outside of the package, thereby minimizing the overall volume of the package. The perforations may also be used as masks for laser energy used to strip insulation from the leads in the vicinity of the perforations.

16 Claims, 10 Drawing Sheets

MICROELECTRONIC COMPONENT CARRIER AND METHOD OF ITS MANUFACTURE

The priority of U.S. provisional application Ser. No. 60/060,389, filed Sep. 30, 1997 is claimed under 35 U.S.C 119(e).

BACKGROUND OF THE INVENTION

1. Field of the Invention

The invention relates generally to miniature non-semiconductor electrical and electronic elements used in printed circuit board applications and particularly to an improved microelectronic component carrier package and method of manufacturing the same.

2. Description of Related Technology

Dual in-line chip carrier packages (DIPs) are well known in the field of electronics. A common example of a DIP is an integrated circuit, which is typically bonded to a ceramic carrier and electrically connected to a lead frame providing opposed rows of parallel electrical leads. An example of an electronic circuit configured in a DIP is a toroid. A toroid is a doughnut shaped piece of magnetic material, together with one or more coils of current carrying wire, typically between AWG 24 to AWG 50, which are wrapped about the doughnut so that the magnetic flux is almost completely confined within it.

The DIPs are traditionally grouped together on a printed circuit board. The DIPs may be integrated with the printed circuit board by inserting the leads of the DIP into holes on the printed circuit board. Alternatively, the DIPs may be surface mounted, having their leads attached to the surface of the printed circuit board with solder. The integrated circuit and ceramic carrier are normally encased in a rectangular plastic or ceramic housing from which the leads extend. Plastic chip carriers are more widely used in commercial and industrial applications where the environment is less sever and where cost is a factor.

The continuing miniaturization of electrical and electronic elements and high density mounting thereof have created increasing challenges relating to fabrication and reliability. Accordingly, there is a need to be able to fabricate increasingly small and reliable microelectronic packages which contain the miniaturized electrical and electronic elements, and to do so at a minimum cost.

Due largely to their design and construction, prior art methods of manufacturing microelectronic component packages require a lengthy series of process steps including drawing and aligning the fine leads associated with the components into proper position, cutting them to the desired length, placing the lead ends in contact with the leadframe, heat stripping and terminating the leads within the package to form a permanent junction, and encapsulating the leads and carrier. This series of steps necessarily requires substantial hand-labor and processing time, thereby adding significantly to the cost of producing each device.

Figure 1:
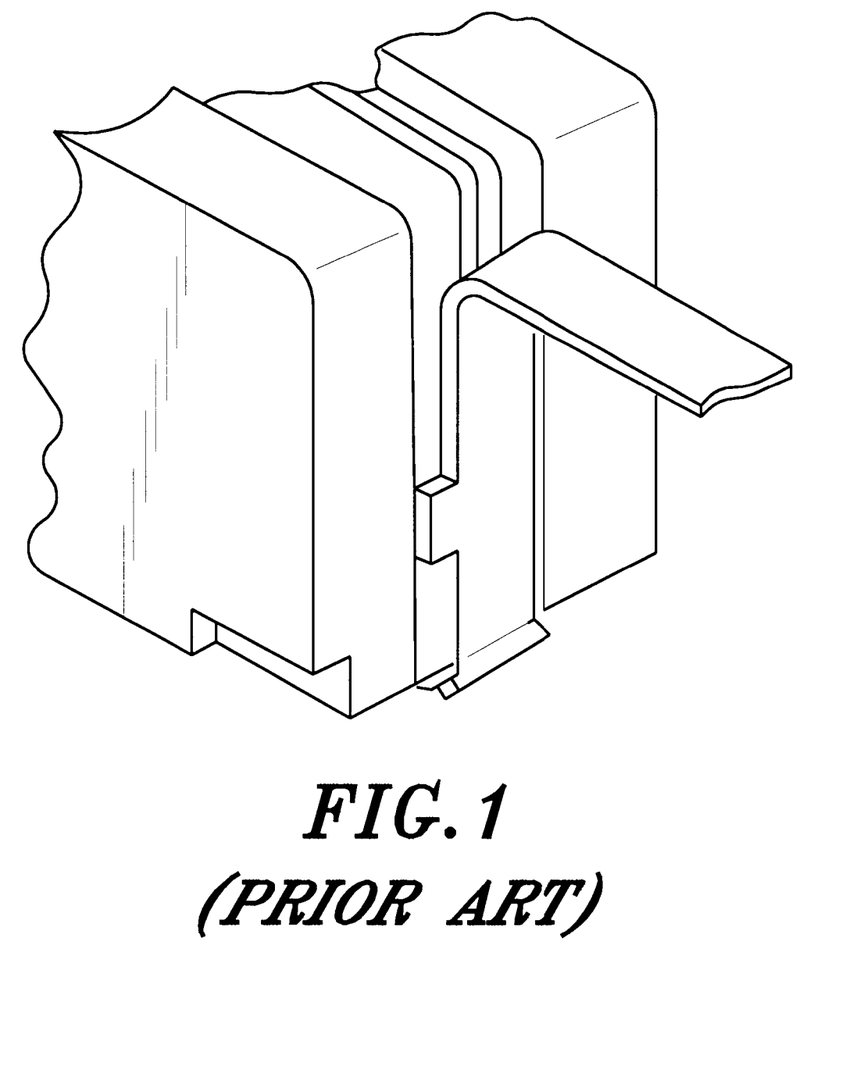
FIG. 1 is a cutaway perspective view of a typical prior art microelectronic component carrier, shown prior to its encapsulation.

FIG. 1 shows a typical prior art component package formed by the aforementioned process. The disadvantages of the component package shown in FIG. 1 is that it occupies an appreciable volume within the package, thereby necessitating a larger overall package. Additionally, the lack of electrical separation between individual leads in this system may increase the probability of electrical faults between leads as well. Since the individual leads are hand-cut and hand-positioned prior to mating the subassembly to the leadframe, sometimes the leads are mis-cut or mis-positioned allowing the leads to touch each other, causing a short circuit or not touch the leadframe causing an open circuit. Manufacturers are in need of an assembly system and a method to insure that the leads are cut to a consistent length and that the leads remain electrically isolated after they are connected to a leadframe.

Currently, there are few tools available to assist the manufacturer in cutting the leads frames to a consistent length. Manufacturers need a tool specifically designed for this purpose. In addition, it would be preferable if the tool could facilitate the joining of the leads to the leadframe as part of the cutting process. The tool should also be able to handle the mass production of component carriers so that the leads of more than one component carrier can be cut at a time.

Accordingly, it would be most desirable to reduce the number of processing steps necessary to manufacture a microelectronic component package, while at the same time allowing for the overall size of the package to be reduced, and its reliability increased.

SUMMARY OF THE INVENTION

The invention satisfies the aforementioned needs by providing an improved microelectronic component carrier and method of its manufacture.

In a first aspect, the present invention provides an improved microelectronic component carrier which utilizes one or more specially constructed guide channels to locate and position the component leads in relation to specially constructed perforations in the carrier leadframe. These perforations are sized and shaped to receive each lead while stripping away the insulation on the lead in the region of the leadframe, thereby eliminating one or more manufacturing process steps. The guide channels also act to electrically isolate the leads, thereby minimizing the potential for electrical fault.

In a first embodiment, each lead is automatically positioned with respect to its respective receiving perforation by way of a specially shaped guide channel in the component carrier, forced into the perforation by way of a special processing tool, and maintained therein by way of a frictional interference fit. The perforations in the leadframe (along with the inserted lead ends) are maintained outside of the package and aligned with the guide channels in order to conserve space. Additionally, the carrier package bottom may be left open for later access to the carrier internal components. In another embodiment, each of the leads is maintained in electrical contact with the surrounding leadframne by way of a eutectic solder or similar bonding process. A third embodiment uses thermal compression bonding to connect each insulated lead to the leadframe.

In a second aspect, the present invention provides an improved method of manufacturing a microelectronic component carrier package wherein the number of processing steps is reduced. Specifically, the microelectronic component is secured within the carrier recess, and the leads routed through their respective channels. The uncut and insulated leads are then inserted into their respective leadframe perforations using a specially designed tool. The size and shape of the perforations result in the insulation being stripped from each lead, and each lead conductor being cut to the appropriate length during insertion. In one embodiment, an interference fit is formed between the stripped end of the lead and the surrounding edges of the perforation during insertion, thereby capturing the lead in fixed relationship to the leadframe. The leadframe members are then formed to the desired shape and the package is completed. In a second embodiment, the stripped lead may be joined to the leadframe using solder or other bonding process. Alternatively, the insulation may be laser-stripped from the leads and subsequently bonded to the leadframe.

DETAILED DESCRIPTION OF THE INVENTION

The following detailed description presents a description of certain specific embodiments of the present invention. However, the invention can be embodied in a multitude of different ways as defined by the claims. In this description, reference is made to the drawings wherein like parts are designated with like numerals throughout.

Figure 2:
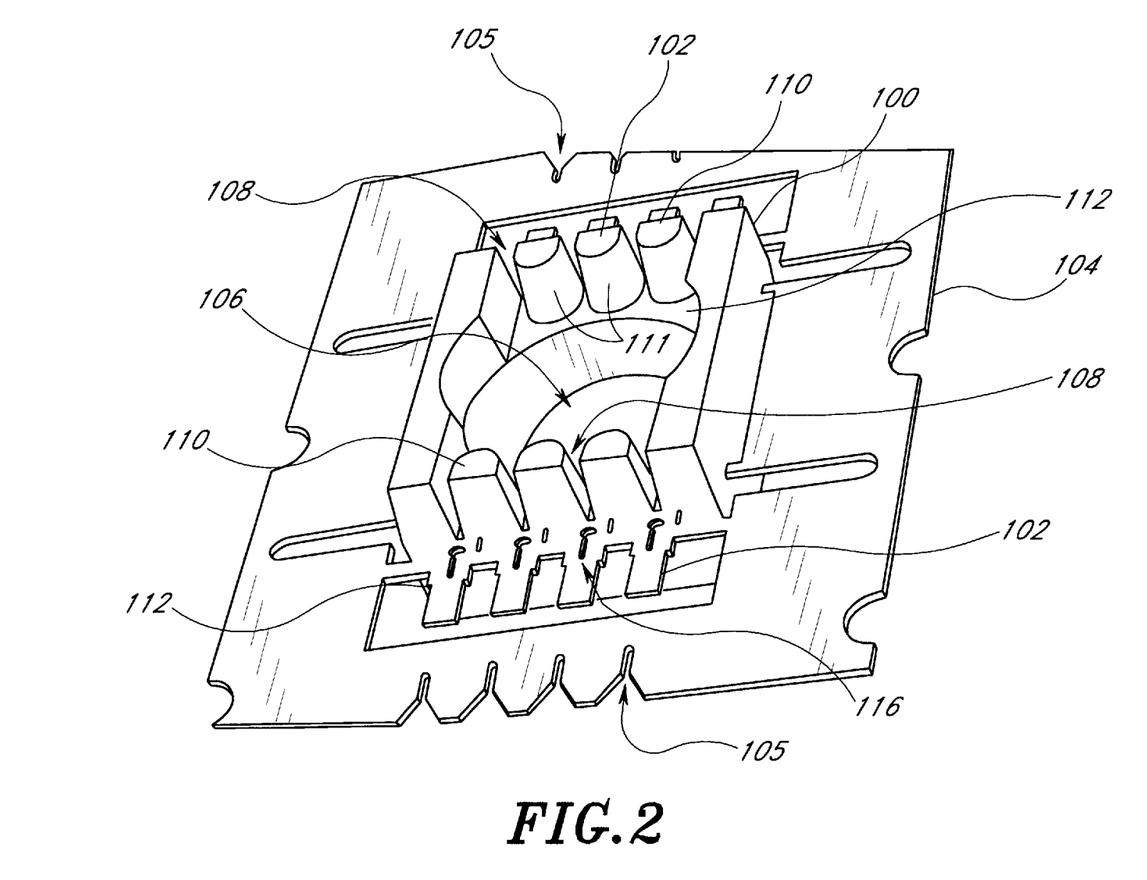
FIG. 2 is a perspective view of a first embodiment of a microelectronic component carrier with leadframe installed.

Referring to FIG. 2, it is seen that a component carrier 100 is centrally located on a leadframe 104. The leadframe 104 is constructed of an electrically conductive material, and is further equipped with lead alignment slots 105 that extend inwardly from the periphery of the leadframe 104 and extend toward and in axial alignment with the lead elements 102. In one embodiment of the invention, the component carrier 100 is formed of a moldable non-conductive polymer such as polyethylene or fluorpolymer, for example, thereby providing ease of manufacturing and electrical insulation for the microelectronic component located on a base in a carrier recess 106. A plurality of electrical lead guide channels 108 are formed about the periphery of the carrier recess 106 by vertical risers 110 and a horizontal base section 112 of the component carrier 100. In this first embodiment of the invention, the vertical risers 1 10 are located adjacent to the leadframe lead elements 102 and are semicircular in cross-section, although other cross-sectional shapes, which present a smooth inner surface 111 for the component electrical leads to be routed over, may be used with equal success (shown in FIGS. 6 and 7). The lateral vertical risers 110 are also progressively tapered upward from the carrier base section 112 so as to form tapered guide channels 108 between the vertical risers 110. In this fashion, component leads inserted into the guide channels 108 are aligned with their respective lead elements 102 when the lead is drawn to the bottom of the guide channel (e.g., when it is brought in contact with the base section 112).

Figure 3:
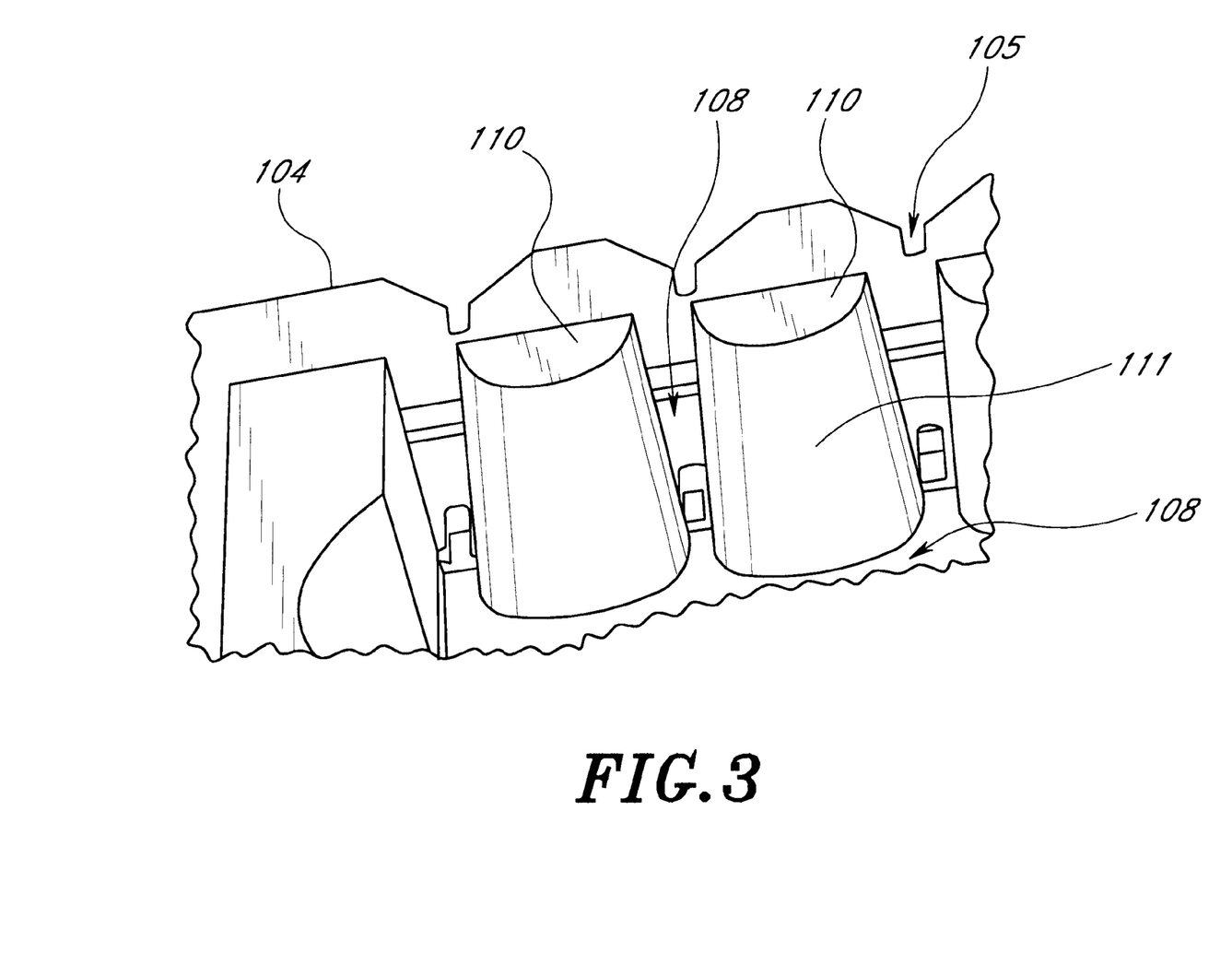
FIG. 3 is a detailed perspective view taken along lines 3—3 of FIG. 2, illustrating one of the lead guide channels of the microelectronic component carrier.

FIG. 3 is a detailed perspective view of the vertical risers 110 of the component carrier 100 of FIG. 2. From this figure it will be appreciated that substantial physical separation of the individual leads is also maintained by the invention, thereby reducing the potential for shorting between leads which may result from damage or stripping of the lead insulation during processing.

Figure 4:
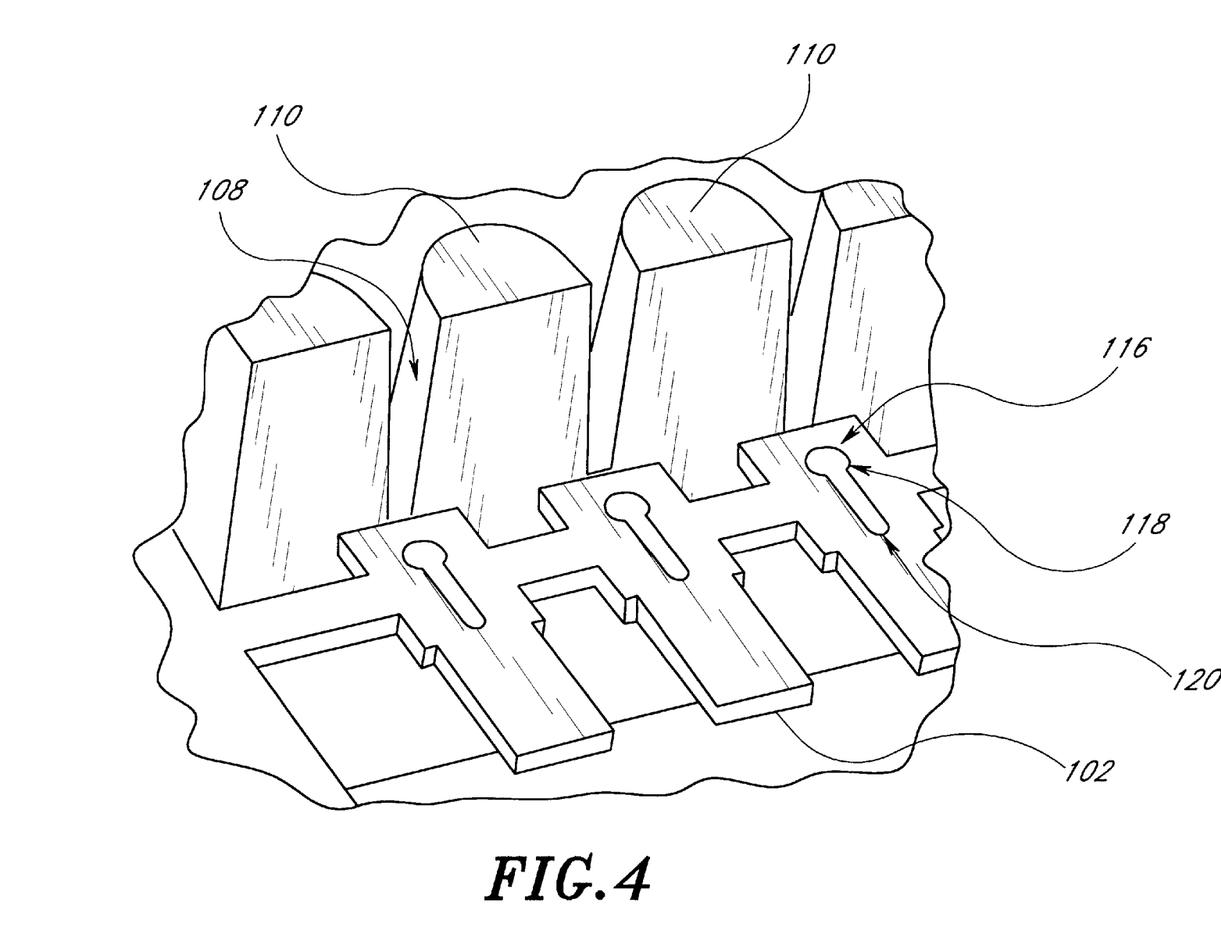
FIG. 4 is a detailed perspective view of the plurality lead frame perforations of the invention.

Referring now to FIGS. 2 and 4, a plurality of perforations 116 are located on the lead frame lead elements 102 and in proximity to the outer edge of the guide channels 108. Furthermore, the perforations 116 are both laterally and vertically aligned with the bottom of their respective guide channels 108 formed by the base section 112 and the two adjacent vertical risers 110. Accordingly, a lead placed in a given guide channel 108 and the alignment slot 105 is routed directly over its associated perforation without the need for further alignment.

Figure 5:
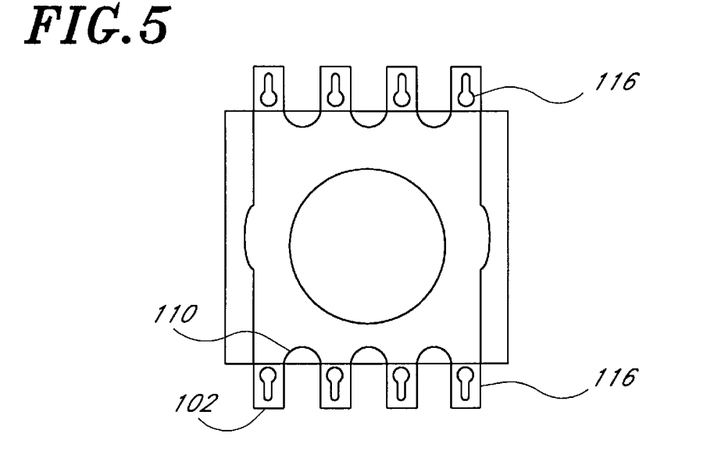
FIG. 5 is a bottom plan view illustrating a first embodiment of the microelectronic component carrier.
Figure 6:
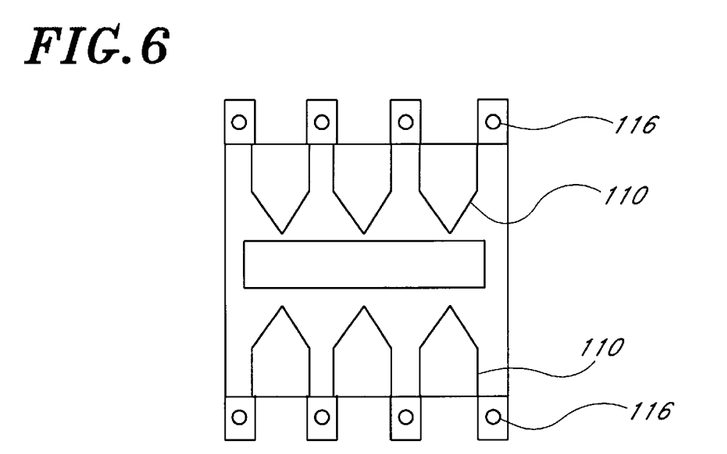
FIG. 6 is a bottom plan view illustrating a second embodiment of the microelectronic component carrier.
Figure 7:
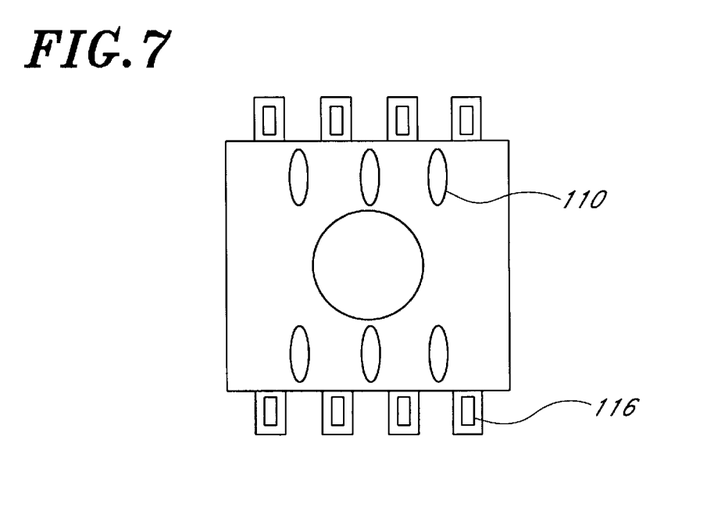
FIG. 7 is a bottom plan view illustrating a third embodiment of the microelectronic component carrier.

FIGS. 5, 6 and 7 illustrate some of the various shapes and forms of the perforations 116 and the vertical risers 110 that may be utilized. FIG. 5 illustrates that in this first embodiment, the perforations 116 are shaped as keyholes and the vertical risers 110 are semi-cylindrical in cross-section. FIG. 6 illustrates a second embodiment of the microelectronic component carrier having differently shaped perforations 116 and vertical risers 110. In this embodiment, the perforations 116 are shaped as ovals, and the vertical risers 110 are shaped cross-sectionally as pentagons. In a third embodiment illustrated in FIG. 7, the perforations 116 are shaped as rectangles and the vertical risers 110 are shaped cross-sectionally as ellipsoids.

Referring again to FIG. 4, the perforations 116 define a "keyhole" shaped cross-sections, each with a circular region 118 oriented closest to its associated guide channel 108. The slotted regions 120 of each perforation 116 are longitudinally aligned with the guide channels 108. The slotted regions 120 can thus partially receive the insulated leads during assembly. After receiving the insulated leads, a specially constructed processing tool is used to downwardly bias the leads simultaneously against the lead elements 102. When downward force is exerted on the portion of the leads over the slotted regions 120, the lead insulation in those regions are stripped away, the stripped portion of the leads are inserted deeper into the slotted regions 120 and the leads are then severed to the appropriate length by the distal edge of the slotted regions 120. It should be noted that in one embodiment of the perforations 116, the diameter of the slotted regions 120 of each of the perforations 116 are sized to form an interference fit with the leads inserted therein; however, bonding and electrical contact between the leads and leadframe element 102 may be accomplished by a variety of other techniques such as eutectic soldering, adhesives, or thermal compression bonding.

The circular regions 118 of each of the perforations 116 shown in FIG. 4 act as a stress relief for the lead between the edge of the guide channels 108 and the interference fit (or bonded joint, as discussed below) in the slotted regions 120. A small "loop" of lead is ultimately formed in the circular regions 118 of each of the perforations 116 when the leadframe element 102 is deformed upward during final component assembly processing. In this manner, thermal or physical stresses on the lead are mitigated, thereby increasing the lead's longevity and overall component reliability.

Figure 8:
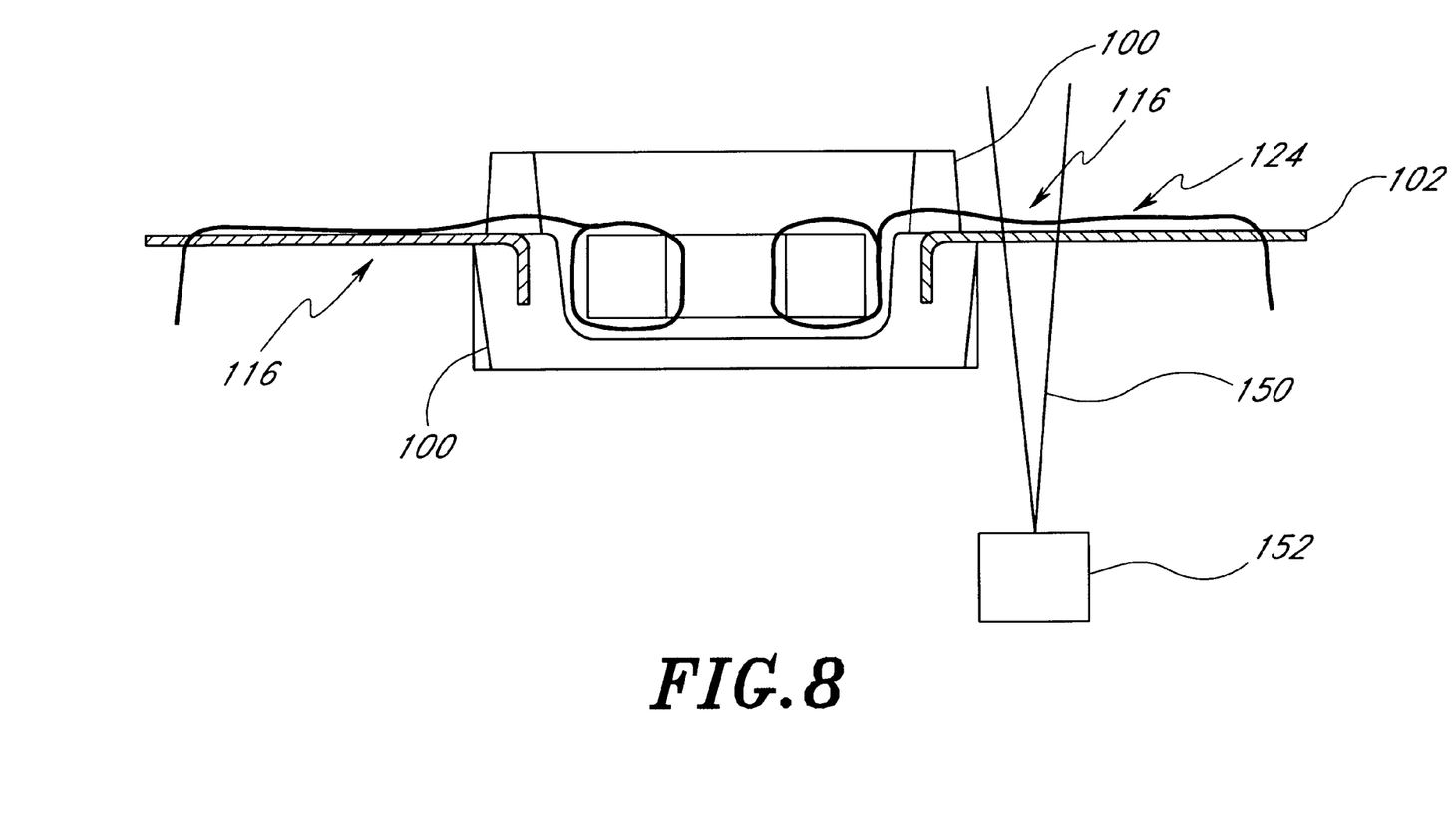
FIG. 8 is a side elevational view of a first embodiment of a laser source for stripping the insulation of the component leads.

FIG. 8 depicts one embodiment of a laser source for stripping the insulation of the component leads. The perforations 116 are used as a template or mask for laser energy that is used to strip the insulation from the positioned lead. Such a technique is useful when utilizing leads whose insulation is not heat-strippable. Specifically, a beam of laser energy 150 from a laser source 152 incident on the underside of the leadframe element 102 acts to strip insulation from the leads 124 in the region of the perforations 116 only. Controlled stripping of the leads 124 only near the electrical junction to the leadframe 104 helps prevent shorting of the leads in other areas. Under certain circumstances, it may be desirable from a cost or processing standpoint to laser-strip the insulation from the bottom of the leads 124 in the region of the perforations 116 prior to joint formation, as opposed to having the edges of the perforations 116 strip the insulation as was previously described.

Method of Manufacturing

Figure 9A:
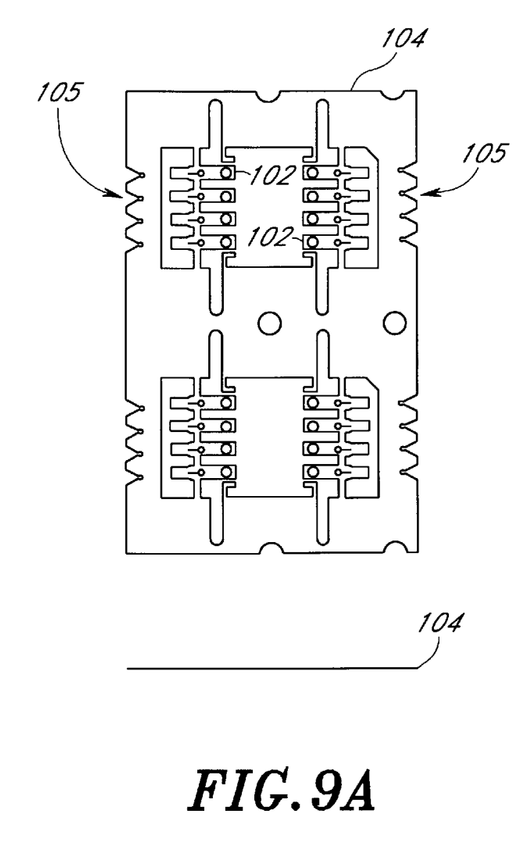
FIGS. 9a through 9i are bottom plan views illustrating the microelectronic component carrier of FIG. 2 during various stages of its manufacture.
Figure 9B:
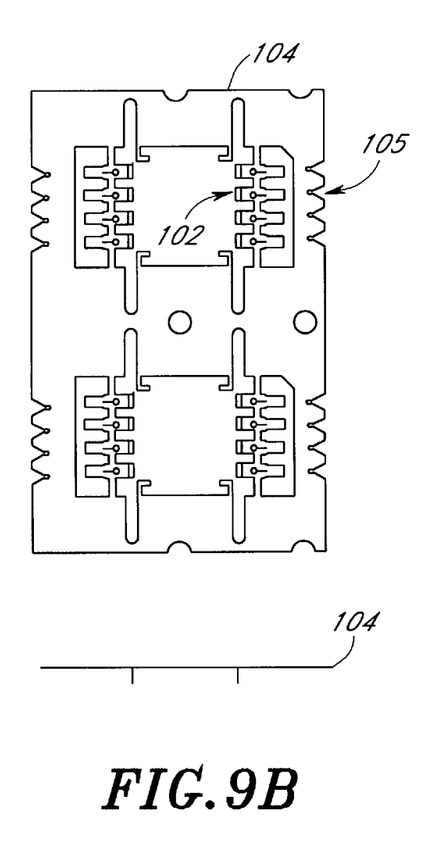
Figure 9C:
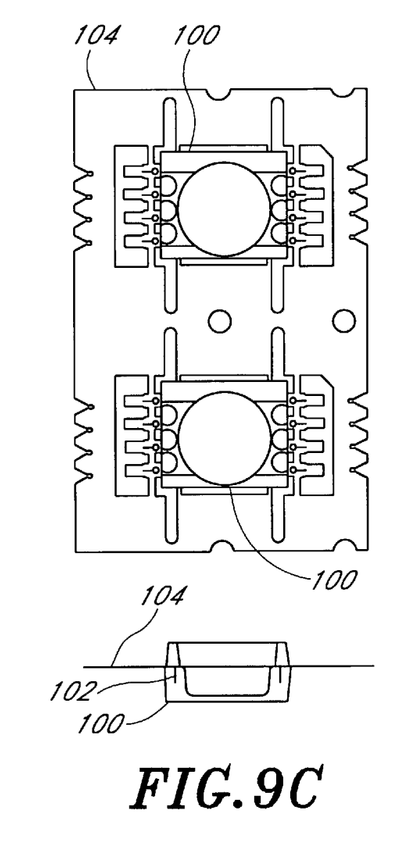
Figure 9D:
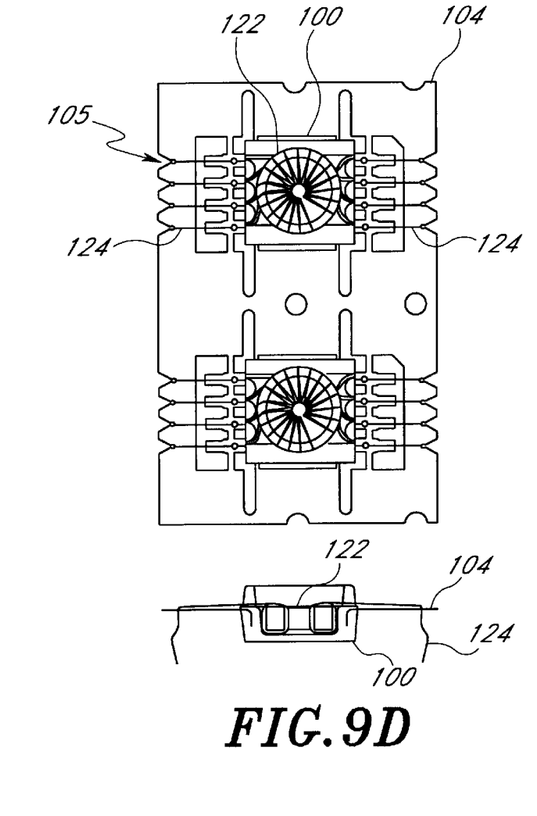
Figure 9E:
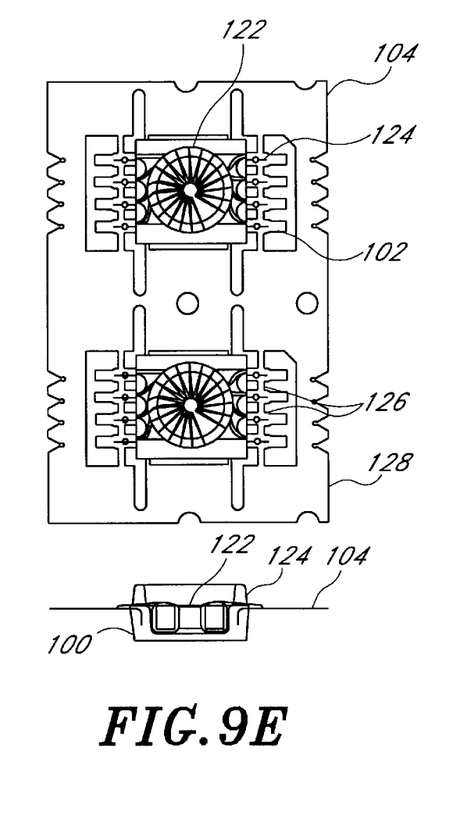
Figure 9F:
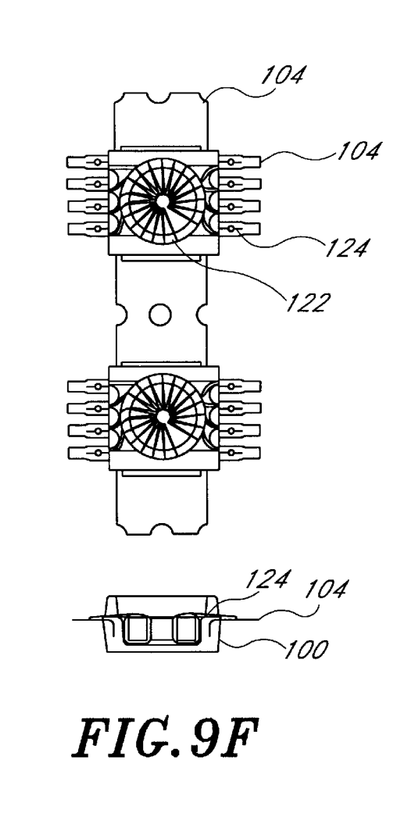
Figure 9G:
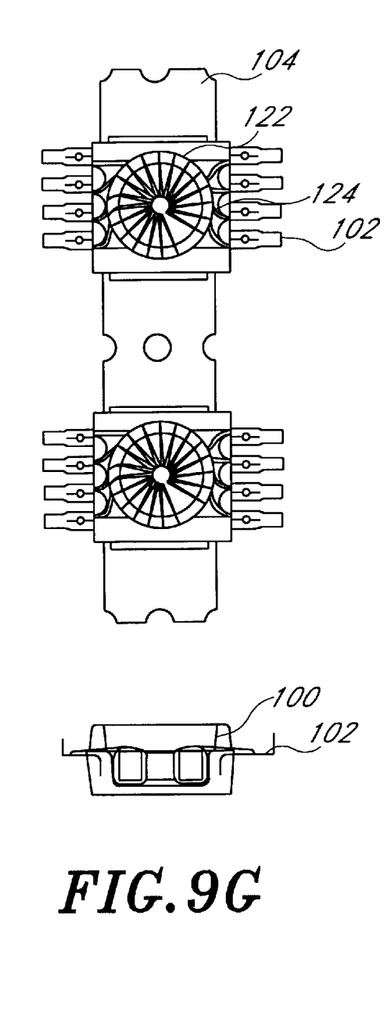
Figure 9H:
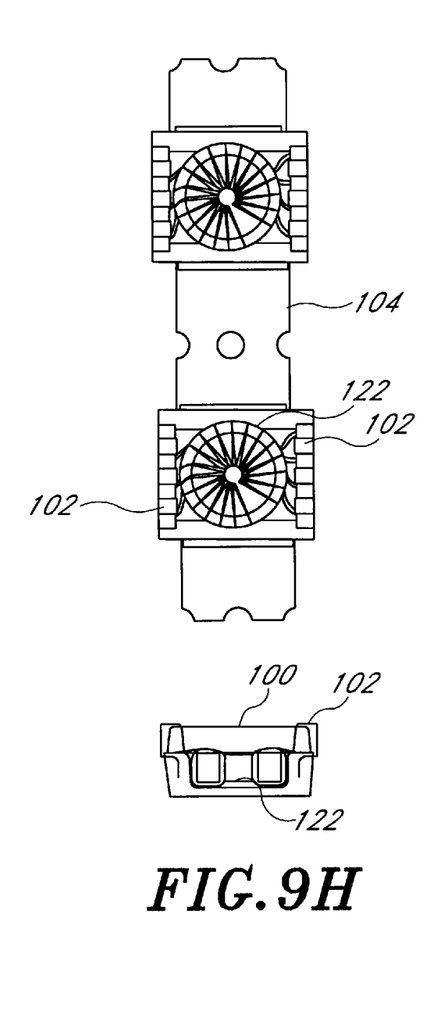
Figure 9I:
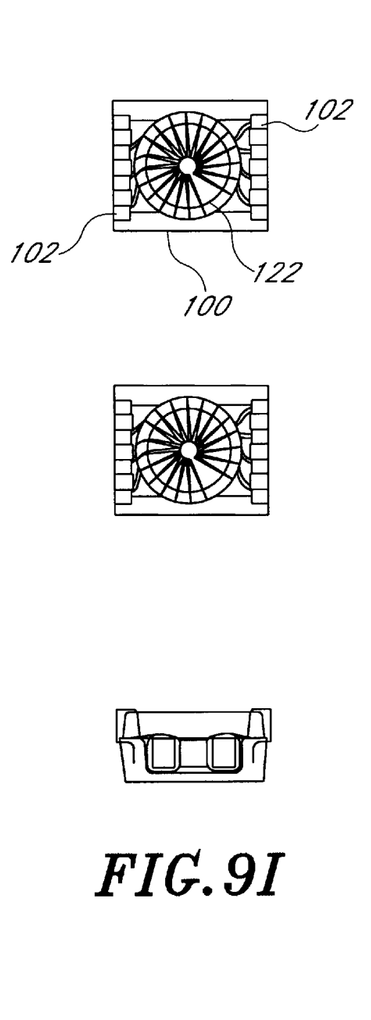

FIGS. 9a through 9i depict the component carrier in various states of manufacture. First, portions of the leadframe 104 are bent upward to receive the component carrier 100 (FIGS. 9a and 9b). The component carrier 100 is then molded onto the leadframe 104 to form a single unit (FIG. 9c). Next, at least one microelectronic component 122, such as a toroid is inserted into the carrier 100 (FIG. 9d). Optionally, the microelectronic component may be bonded the component to the carrier 100. The component leads 124 of the component are routed through their respective guide channels 108, alignment slots 105, and over the perforations 116. Next, a special processing tool presses a plurality of component leads 124 simultaneously into their respective perforations 116, thereby severing the leads 124 to the desired length (FIG. 9e). The leadframe dambars 126 and outer frame 128 are removed (FIG. 9f), and the leads 124 are optionally bonded to the lead elements 102. The lead elements 102 are then deformed upward so as to roughly conform with the sides of the component carrier 100 (FIGS. 9g and 9h). Finally, if a multi-package leadframe 104 was selected, each of the dies in the package are separated (FIG. 9i).

It should be noted that as a result of implementing this process, no encapsulation of the carrier 100 or leadframe 104 is required, thereby further reducing the processing necessary to manufacture the device and providing accessibility to the microelectronic component 122. Furthermore, many of the steps in the disclosed process may be performed simultaneously or even in different sequence than that set forth above, while still accomplishing the desired results of reduced package size and reduced processing.

Figure 10:
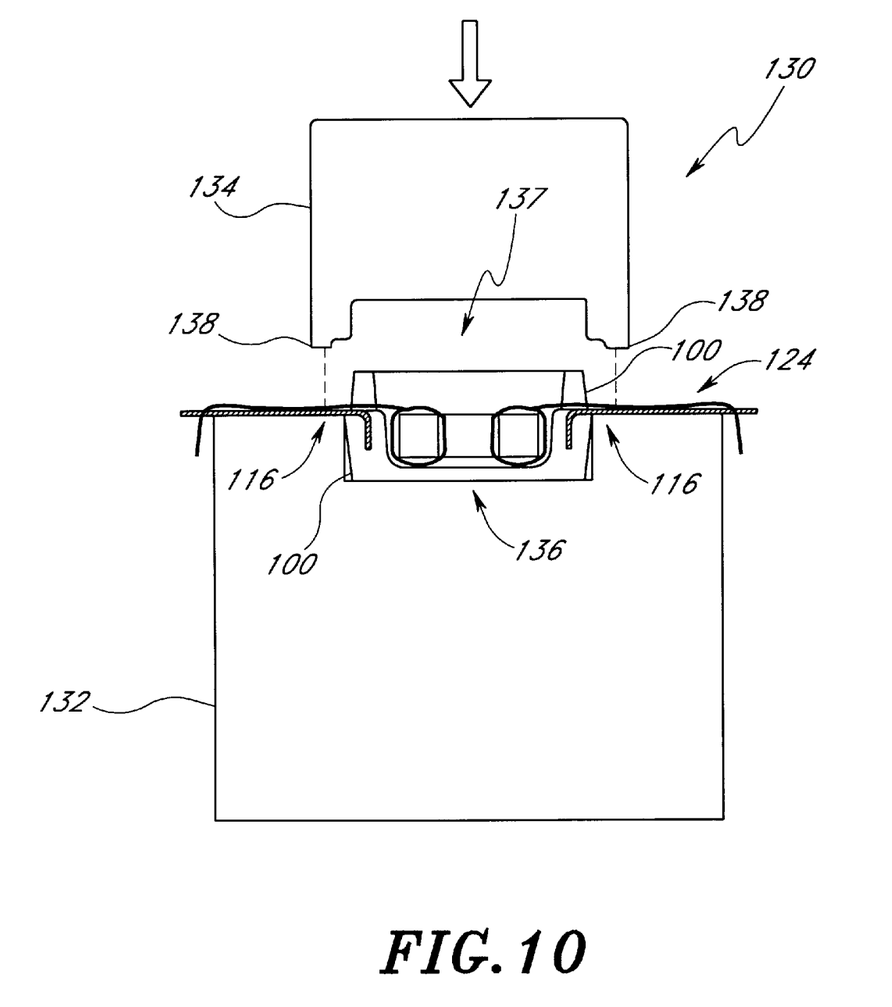
FIG. 10 is a side elevational view of a first embodiment of a processing tool used for simultaneously inserting the component leads into the plurality leadframe perforations.

FIG. 10 depicts one embodiment of a processing tool 130 used for simultaneously inserting the component leads 124 into the leadframe perforations 116. The microelectronic component leads 124 are inserted into their respective perforations 116 and severed after lead routing through the use of the processing tool 130. The processing tool 130 has a base section 132 and a top section 134 which cooperate during processing to insert and sever the leads 124. The base section 132 has a recess 136 into which one or more component carriers 100 fit, the recess being sized to mitigate lateral motion of the component carrier(s) 100 within the recess. The top section 134 also has a recess 137 into which the top portion of the component carrier 100 fits when the base section 132 and top section 130 sections are joined. A series of downward protruding elements 138 on the top section 134 of the tool are sized and aligned so as to fit over the perforations 116 in the lead elements 102 when the component carrier 100 is cradled in the recesses 136, 137 and the base and top sections 132, 134 are joined. In this manner, the component carrier 100 with pre-routed leads 124 is inserted into the base section recess 136, and then the top section 134 is aligned with and pressed down over the carrier 100. As previously discussed, the downward pressure of the protruding elements 138 on the leads 124 (i) strips the insulation from the leads 124, (ii) severs the leads 124 to the desired length, and (iii) inserts the severed leads 124 into the perforations 116. One embodiment of the processing tool 130 can be used to process four component carriers 100 simultaneously (up to thirty-six separate leads), although it can be appreciated that other configurations are possible.

While the above detailed description has shown, described, and pointed out the fundamental novel features of the invention as applied to various embodiments, it will be understood that various omissions, substitutions, and changes in the form and details of the device or process illustrated may be made by those skilled in the art without departing from the spirit of the invention.

What is claimed is:

1. A component carrier, said carrier comprising:
   a base for receiving one or more components;
   a plurality of guide channels located in proximity to said base, said guide channels configured to route one or more electrical leads; and
   a lead frame assembly having one or more receiving mechanisms for measuring and cutting the one or more electrical leads therein, said receiving mechanisms positioned in proximity to said guide channels.

2. The component carrier as defined in claim 1, wherein the one or more receiving mechanisms are perforations that are shaped as keyholes.

3. The component carrier as defined in claim 2, wherein circular portions of the keyhole perforations are positioned to be the most proximal part of the keyhole perforations with respect to an adjacent guide channel.

4. The component carrier as defined in claim 1, further comprising a component which is positioned on the base.

5. The component carrier as defined in claim 4, further comprising a plurality of leads connected to the component.

6. The component carrier as defined in claim 5, wherein at least one of the plurality of leads is connected to the lead frame assembly proximally to one of the receiving mechanisms.

7. The component carrier as defined in claim 5, wherein one of the plurality of leads is connected to the lead frame assembly by eutectic soldering.

8. The component carrier as defined in claim 5, wherein one of the plurality of leads is connected to the lead frame assembly by adhesives.

9. The component carrier as defined in claim 5, wherein one of the plurality of leads is connected to the lead frame by compression bonding.

10. The component carrier as defined in claim 1, wherein the component carrier is integrated into a computer.

11. The component carrier as defined in claim 1, wherein the carrier is integrated into a peripheral device.

12. The component carrier as defined in claim 1, wherein the component carrier is integrated into a printed circuit board.

13. The component carrier as defined in claim 1, further comprising lead alignment slots on the leadframe for positioning leads across the perforations.

14. The component carrier as defined in claim 1, wherein the base is made of polyethylene.

15. The component carrier as defined in claim 1, wherein the base is made of a fluorpolymer.

16. A component carrier, said carrier comprising:

a base for receiving one or more components;

a plurality of guide channels located in proximity to said base, said guide channels permitting the routing of one or more electrical leads therein; and a lead frame assembly having one or more keyhole shaped perforations therein, said perforations positioned in proximity to said guide channels wherein circular portions of the keyhole perforations are positioned to be the most proximal part of the keyhole perforations to an adjacent guide channel, said perforations further being sized so as to frictionally receive said leads.

* * * * *